United States Patent
Ge

(10) Patent No.: US 12,200,885 B2
(45) Date of Patent: Jan. 14, 2025

(54) HINGE FOR MOBILE ELECTRONIC TERMINAL HAVING INWARD-FOLDABLE FLEXIBLE SCREEN

(71) Applicant: HANGZHOU AMPHENOL PHOENIX TELECOM PARTS CO., LTD., Zhejiang (CN)

(72) Inventor: Lifeng Ge, Zhejiang (CN)

(73) Assignee: HANGZHOU AMPHENOL PHOENIX TELECOM PARTS CO., LTD., Zhejiang (CN)

( * ) Notice: Subject to any disclaimer, the term of this patent is extended or adjusted under 35 U.S.C. 154(b) by 224 days.

(21) Appl. No.: 17/917,360

(22) PCT Filed: Mar. 30, 2021

(86) PCT No.: PCT/CN2021/083901
§ 371 (c)(1),
(2) Date: Oct. 6, 2022

(87) PCT Pub. No.: WO2021/204019
PCT Pub. Date: Oct. 14, 2021

(65) Prior Publication Data
US 2023/0156942 A1    May 18, 2023

(30) Foreign Application Priority Data
Apr. 9, 2020  (CN) .......................... 202020514935.2

(51) Int. Cl.
*H05K 5/02* (2006.01)
*F16C 11/04* (2006.01)
(Continued)

(52) U.S. Cl.
CPC ............ *H05K 5/0226* (2013.01); *F16C 11/04* (2013.01); *G06F 1/1681* (2013.01); *H04M 1/022* (2013.01);
(Continued)

(58) Field of Classification Search
CPC ......... H05K 5/0226; F16C 11/04; G06F 1/16; G06F 1/1681
See application file for complete search history.

(56) References Cited

U.S. PATENT DOCUMENTS

| 7,751,195 | B2 * | 7/2010 | Barnett ................ H05K 5/0226 |
| | | | 361/679.55 |
| 8,971,031 | B2 * | 3/2015 | Mok ..................... G06F 1/1656 |
| | | | 361/679.27 |
| 9,235,239 | B2 * | 1/2016 | van Dijk ............. H04M 1/0268 |
| 9,250,733 | B2 * | 2/2016 | Lee ........................ G06F 1/1641 |

(Continued)

FOREIGN PATENT DOCUMENTS

| CN | 205657718 U | 10/2016 |
| CN | 208112673 U | 11/2018 |

(Continued)

*Primary Examiner* — Rockshana D Chowdhury
*Assistant Examiner* — Martin Antonio Asmat Uceda
(74) *Attorney, Agent, or Firm* — MUNCY, GEISSLER, OLDS & LOWE, P.C.

(57) ABSTRACT

A hinge for a mobile electronic terminal having an inward-foldable flexible screen is provided in the present invention. A support structure having a left rotation support plate and a right rotation support plate is provided in a middle housing; the support structure comprises a support part of the left rotation support plate and a support part of the right rotation support plate; the support part of the left rotation support plate and the support part of the right rotation support plate are rotatable parts; the support part of the left rotation support plate and the support part of the right rotation support plate rotate to form a cross structure, so as to support the left rotation support plate and the right rotation support plate when the electronic terminal having the inward-foldable flexible screen is flattened. By means of the X-shaped cross structure, the left and right rotation support plates in the middle can be stably supported when the terminal is flattened, the motion angle of the support structure is reduced, only a small motion space is needed, and a require- (Continued)

ment of reducing the thickness of the terminal is met while it is ensured that the left and right rotation support plates are supported.

9 Claims, 3 Drawing Sheets

(51) Int. Cl.
  *G06F 1/16* (2006.01)
  *H04M 1/02* (2006.01)
(52) U.S. Cl.
  CPC ......... *G06F 1/1652* (2013.01); *H04M 1/0268* (2013.01)

(56) References Cited

U.S. PATENT DOCUMENTS

| | | | | |
|---|---|---|---|---|
| 10,831,243 | B2* | 11/2020 | Kim | G06F 1/1652 |
| 11,622,457 | B2* | 4/2023 | Hsu | G06F 1/1615 |
| | | | | 361/809 |
| 11,856,119 | B2* | 12/2023 | Shang | G06F 1/1652 |
| 2023/0115172 | A1* | 4/2023 | Lombardi | G06F 1/1616 |
| | | | | 361/679.27 |

FOREIGN PATENT DOCUMENTS

| | | |
|---|---|---|
| CN | 109451685 A | 3/2019 |
| CN | 208705766 U | 4/2019 |
| CN | 210122988 U | 3/2020 |
| CN | 212407305 U | 1/2021 |
| TW | 201921222 A | 6/2019 |

\* cited by examiner

HINGE FOR MOBILE ELECTRONIC TERMINAL HAVING INWARD-FOLDABLE FLEXIBLE SCREEN

FIELD OF THE INVENTION

The present invention relates to a hinge for a mobile electronic terminal having an inward-foldable flexible screen.

BACKGROUND OF THE INVENTION

For a mobile electronic terminal, a flexible screen is an ideal screen. A terminal is folded when carrying, and flattened to obtain double display when in use, which can meet the demand for a large-screen display. For a mobile electronic terminal having a flexible screen, it is always hoped that the bending requirements of the flexible screen can be met, and meanwhile, the thickness of the terminal when it is flattened and when it is folded can be as thin as possible. A mobile electronic terminal having an inward-foldable flexible screen is available. When the flexible screen is bent, its bent part will enter the middle housing of the mobile electronic terminal having the inward-foldable flexible screen, and the left and right rotating support plates squeeze the flexible screen to a certain extent on both sides of the middle bending, but when it is flattened, it is difficult to support the left and right rotating support plates.

SUMMARY OF THE INVENTION

The present invention aims to provide a hinge for a mobile electronic terminal having an inward-foldable flexible screen, which can support a left rotation support plate and a right rotation support plate in the middle and reduce the space required by the thickness of the terminal as much as possible. Therefore, the present invention adopts the following technical solutions:

A hinge for a mobile electronic terminal having an inward-foldable flexible screen is provided. The mobile electronic terminal having the inward-foldable flexible screen is provided with a left side flexible screen main support plate, a right side flexible screen main support plate, a middle housing, a left rotation support plate and a right rotation support plate, wherein the left rotation support plate and the right rotation support plate can rotate together with the left side main support plate and the right side main support plate respectively, and rotate relative to the left side main support plate and the side right main support plate respectively; when the mobile electronic terminal having the inward-foldable flexible screen is flattened, the left rotation support plate and the right rotation support plate cover the left side and the right side of the middle housing respectively; when the mobile electronic terminal having the inward-foldable flexible screen is folded, the left rotation support plate and the right rotation support plate incline to the left side main support plate and the right side main support plate respectively, and the inner ends thereof are rotated into the middle housing; the hinge comprises a left side rotation bracket and a right side rotation bracket; a synchronous reverse rotation connecting mechanism is connected between the left side rotation bracket and the right side rotation bracket to realize synchronous reverse rotation; the hinge for the mobile electronic terminal having the inward-foldable flexible screen is characterized in that:

the hinge is provided with a support structure having the left rotation support plate and the right rotation support plate in the middle housing; the support structure comprises a support part of the left rotation support plate and a support part of the right rotation support plate; the support part of the left rotation support plate and the support part of the right rotation support plate are rotatable parts; and the support part of the left rotation support plate and the support part of the right rotation support plate rotate to form a cross structure, so as to support the left rotation support plate and the right rotation support plate when the electronic terminal having the inward-foldable flexible screen is flattened.

The support part of the left rotation support plate and the support part of the right rotation support plate rotate only when the mobile electronic terminal having the inward-foldable flexible screen is flattened to a certain degree from a folded state, and the support parts are prevented from rotating reversely when the mobile electronic terminal having the inward-foldable flexible screen is flattened. In this way, the two support parts do not rotate within a large rotation range of the hinge and start to rotate before supporting is needed, and thus the motion space needed by the support parts can be further reduced.

Further, a right end of the support part of the left rotation support plate is rotatably connected with a first shaft which is positioned on the right side of the middle housing and rotates in the same direction as the right side rotation bracket; and a left end of the support part of the right rotation support plate is rotatably connected with a second shaft which is positioned on the left side of the middle housing and rotates in the same direction as the left side rotation bracket.

Further, the left rotation support plate and the right rotation support plate are provided with connecting pins parallel to an axis of the hinge, and the left end of the support part of the left rotation support plate and the right end of the support part of the right rotation support plate are provided with connecting holes connected with the connecting pin of the left rotation support plate and the connecting pin of the right rotation support plate respectively.

Further, the mobile electronic terminal having the inward-foldable flexible screen is provided with reset springs of the left rotation support plate and the right rotation support plate respectively, so that the left rotation support plate is in tightly mated with the support part, and the right rotation support plate is in tightly mated with the support part.

Further, the first shaft is connected with a first driving block, the second shaft is connected with a second driving block, a driving idle stroke is formed between the first driving block and the support part of the left rotation support plate, and a driving idle stroke is formed between the second driving block and the support part of the right rotation support plate, so that the driving blocks drive the support parts to rotate only when the mobile electronic terminal having the inward-foldable flexible screen is flattened to a certain degree from a folded state, and the support parts are prevented from rotating reversely when the mobile electronic terminal having the inward-foldable flexible screen is flattened.

Further, an outer end of the left rotation support plate and an outer end of the right rotation support plate are rotatably connected with the left side rotation bracket and the right side rotation bracket respectively.

Due to the adoption of the technical solution of the present inventions, by means of the X-shaped cross structure, the left and right rotation support plates in the middle can be stably supported when the terminal is flattened, the motion angle of the support structure is reduced, only a small motion space is needed, and a requirement of reducing the thickness of the terminal is met while it is ensured that the left and right rotation support plates are supported.

BRIEF DESCRIPTION OF THE DRAWINGS

As shown in FIG. 3, at an opening angle, a support part of a left rotation support plate and a support part of a right rotation support plate are not driven to rotate, or the left rotation support plate and the right rotation support plate are still in an in-situ state after being reset by a torsional spring.

DETAILED DESCRIPTION

Figure 1:
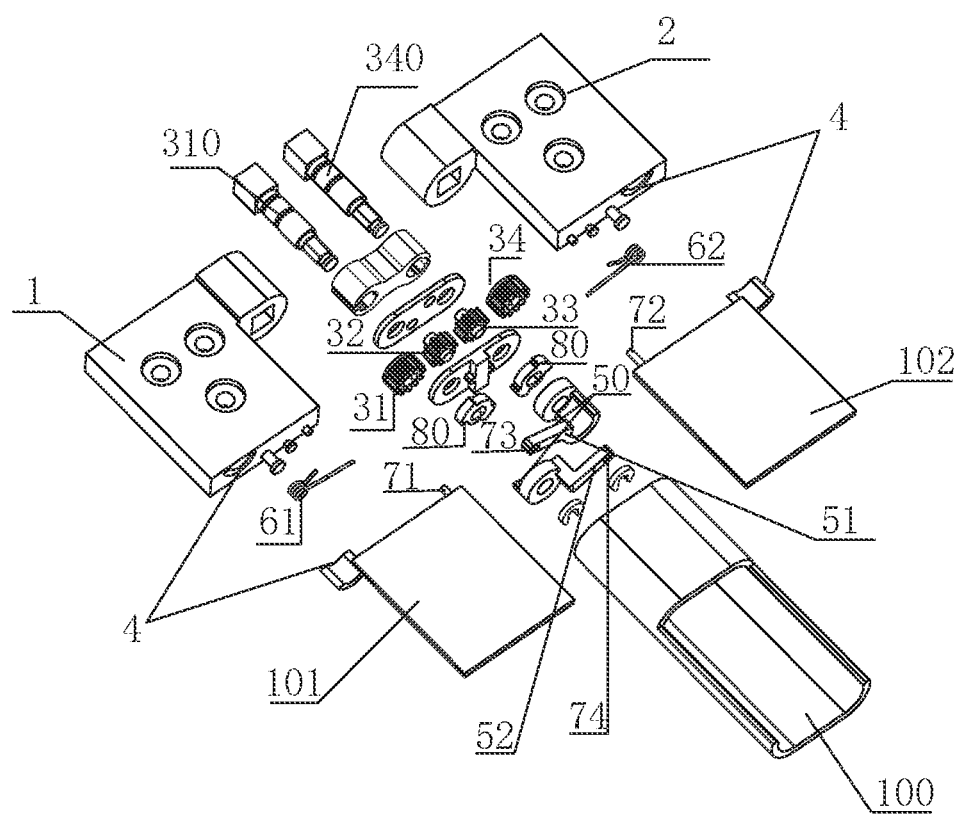
FIG. 1 is an exploded view of a structure according to an embodiment of the present invention.

Referring to the figures, a hinge for a mobile electronic terminal having an inward-foldable flexible screen is provided. The mobile electronic terminal having the inward-foldable flexible screen is provided with a left side flexible screen main support plate and a right side flexible screen main support plate (not shown in the figures), a middle housing 100, a left rotation support plate 101 and a right rotation support plate 102, wherein the flexible screen main support plates can be fixedly arranged on a left side housing and a right side housing of the mobile electronic terminal having the inward-foldable flexible screen or a part of a left side housing body and a right side housing body. The left side housing and the right side housing are connected with a left side rotation bracket 1 and a right side rotation bracket 2 of the hinge respectively and can rotate respectively around shafts of the left side rotation bracket 1 and the right side rotation bracket 2 together with the left side rotation bracket 1 and the right side rotation bracket 2.

Figure 2:
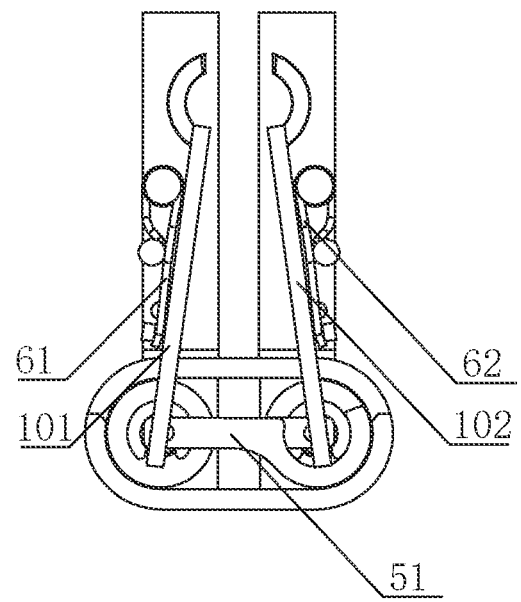
FIGS. 2, 3 and 4 are schematic diagrams illustrating the structure mating of a mobile electronic terminal having an inward-foldable flexible screen in a folding state, an intermediate state between folding and flattening, and a flattening state according to an embodiment of the present invention.
Figure 3:
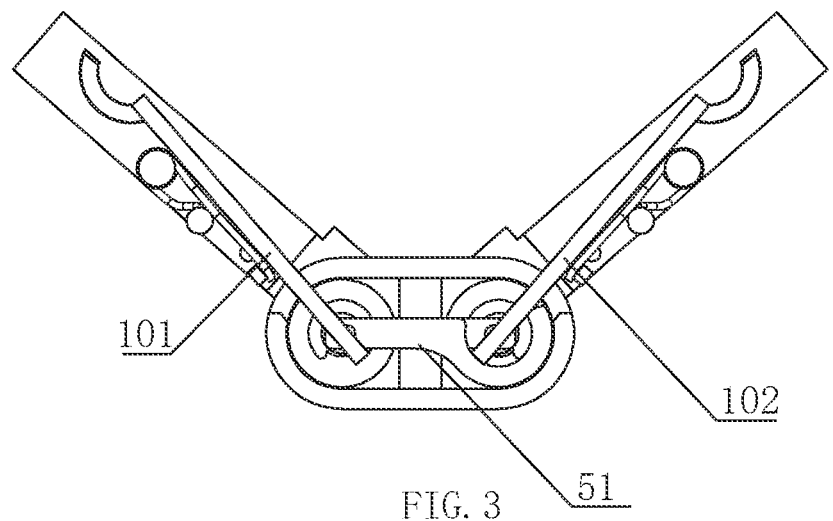

The outer ends of the left rotation support plate 101 and the right rotation support plate 102 are respectively rotationally connected with the left side rotation bracket 1 and the right side rotation bracket 2, thus on the one hand, the left rotation support plate 101 and the right rotation support plate 102 can respectively rotate together with left side main support plate and the right side main support plate, and on the other hand, the left rotation support plate and the right rotation support plate can respectively rotate corresponding to the left side main support plate and the right side main support plate; when the mobile electronic terminal having the inward-foldable flexible screen is flattened, the left rotation support plate 101 and the right rotation support plate 102 respectively cover the left side and the right side of the middle housing 100 (see FIG. 4); and when the mobile electronic terminal having the inward-foldable flexible screen is folded, the left rotation support plate 101 and the right rotation support plate 102 respectively rotate to incline to the left side main support plate and the right side main support plate, and the inner ends are rotated into the middle housing 100 (see FIG. 2). Thus, the hinge, the middle housing 100, the left rotation support plate 101 and the right rotation support plate 102 can form a mounting module, which facilitates the high-precision manufacturing and can remove the errors caused by manufacturing of different parts by different suppliers. Alternatively, the left rotation support plate 101 and the right rotation support plate 102 can be rotatably connected with the left side housing and the right side housing respectively.

The outer end of the left rotation support plate 101 and the outer end of the right rotation support plate 102 can be rotatably connected with the left side rotation bracket 1 and the right side rotation bracket 2 through an arc sliding rail and a rotation connecting structure 4 of a sliding block respectively.

A synchronous reverse rotation connecting mechanism is connected between the left side rotation bracket 1 and the right side rotation bracket 2 of the hinge to realize synchronous reverse rotation, and the synchronous reverse rotation connecting mechanism is arranged in the middle housing 100. In this embodiment, the synchronous reverse rotation connecting mechanism is a gear meshing connecting mechanism composed of four gears or two gears; the synchronous reverse rotation connecting mechanism composed of the four gears comprises a first gear 31, a second gear 32, a third gear 33 and a fourth gear 34 which are sequentially meshed; and a gear shaft 310 of the first gear 31 and a gear shaft 340 of the fourth gear 34 are connected with the left side rotation bracket 1 and the right side rotation bracket 2 respectively and are shafts of the left side rotation bracket 1 and the right side rotation bracket 2 respectively.

Figure 4:
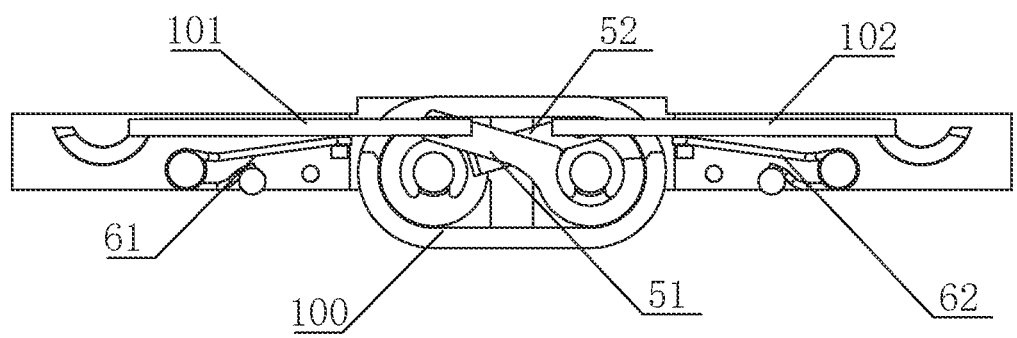
Figure 5:
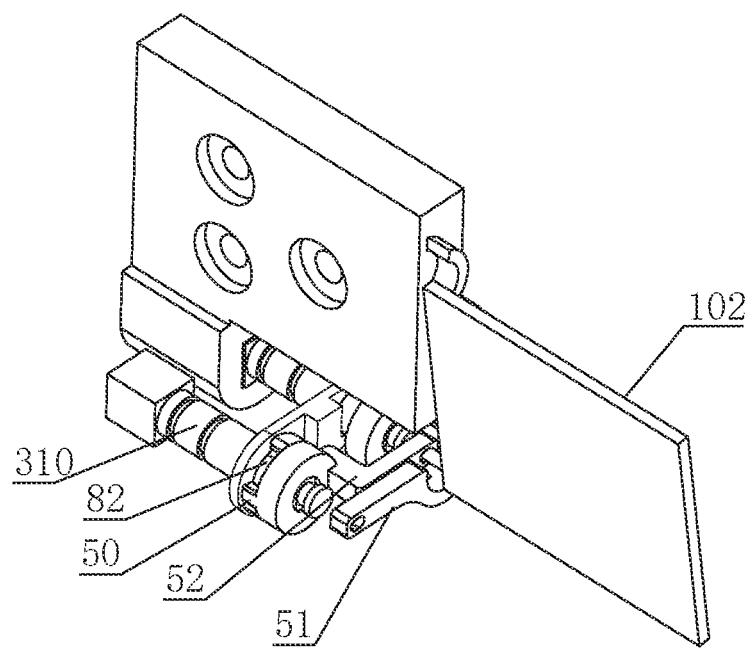
FIGS. 5 and 6 are schematic diagrams illustrating partial structure of a mobile electronic terminal having an inward-foldable flexible screen in folding and flattening states respectively according to an embodiment of the present invention.
Figure 6:
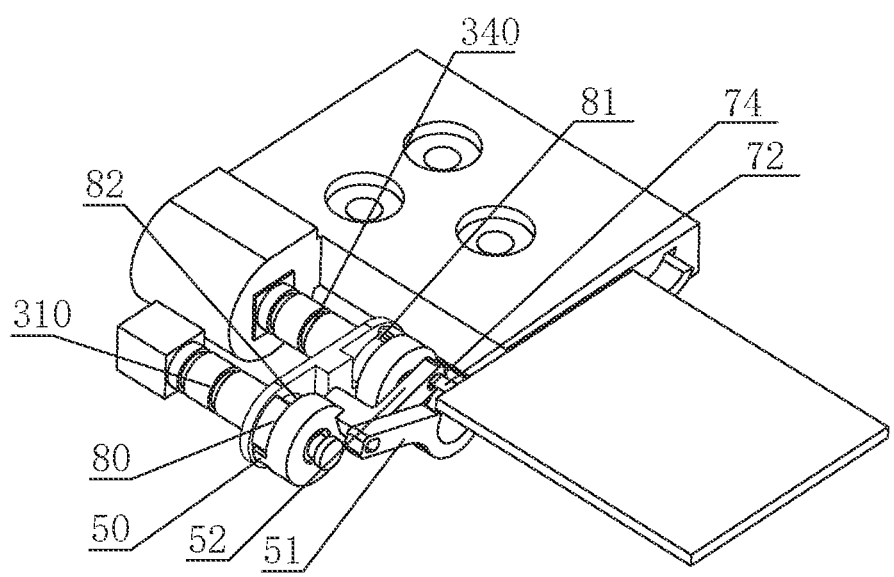

A support structure having a left rotation support plate 101 and a right rotation support plate 102 is provided in a middle housing 100 of the hinge; the support structure comprises a support part 51 of the left rotation support plate 101 and a support part 52 of the right rotation support plate 102; the support part 51 and the support part 52 are rotatable parts; the support part 51 and the support part 52 rotate to form a cross structure, so as to support the left rotation support plate and the right rotation support plate when the electronic terminal having the inward-foldable flexible screen is flattened (FIG. 4 and FIG. 6).

In the embodiments, for the four gear shafts of the synchronous reverse rotation connecting mechanism, the gear shafts 310 and 340 are located at the farthest left and right sides of the middle housing 100 respectively; a right end of the support part 51 of the left rotation support plate 101 is rotatably connected with a first shaft (gear shaft 340) which is positioned on the right side of the middle housing and rotates in the same direction as the right side rotation bracket; and a left end of the support part 52 of the right rotation support plate 102 is rotatably connected with a second shaft (gear shaft 310) which is positioned on the left side of the middle housing and rotates in the same direction as the left side rotation bracket, so that the rotation angle of the support part can be minimized.

The left rotation support plate 101 and the right rotation support plate 102 are provided with connecting pins 71, 72 parallel to an axis of the hinge, and the left end of the support part 51 of the left rotation support plate 101 and the right end of the support part 52 of the right rotation support plate 102 are provided with connecting holes 73, 74 connected with the connecting pin 72 of the left rotation support plate and the connecting pin 72 of the right rotation support plate respectively.

The mobile electronic terminal having the inward-foldable flexible screen is provided with a reset spring 61 of the left rotation support plate 101 and a reset spring 62 of the right rotation support plate 102; the reset springs 61 and 62 can be mounted on the left side rotation bracket 1 and the right side rotation bracket 2 respectively and both work to enable the rotation support plates to be in a trend of inclining to the flexible screen main support plates all the time, namely the clockwise rotating trend of the left rotation support plate 101 and the anticlockwise rotating trend of the right rotation support plate 102 shown in FIG. 4, so that the left rotation support plate 101 is tightly mated with the support part 51, and the right rotation support plate 102 is tightly mated with the support part 52.

The first shaft (the gear shaft 340) is connected with a first driving block 81; the second shaft (the gear shaft 310) is connected with a second driving block 82; the first driving block 81 and the second driving block 82 are annular and are fixed on the shafts respectively, and are provided with driving keys 80; the support parts 51 and 52 are provided with driving mating part 50 mated with the driving keys 80; the annular driving blocks cannot drive the driving mating part 50 of the support parts at the parts without the driving keys 80, so a driving idle stroke is formed between the first driving block 81 and the support part 51 of the left rotation support plate 101, and a driving idle stroke is formed between the second driving block 82 and the support part 52 of the right rotation support plate 102; and therefore, when the mobile electronic terminal having the inward-foldable flexible screen is flattened to a certain degree from a folded state, the first driving block drives the support part 51 to rotate, the second driving block drives the support part 52 to rotate, and the support parts 51 and 52 are prevented from rotating reversely when the mobile electronic terminal having the inward-foldable flexible screen is flattened.

The foregoing description merely describes specific embodiments of the present invention, but the structural features of the present invention are not limited thereto. Any changes or modifications made by those skilled in the art within the field of the invention shall fall within the scope of protection of the present invention.

The invention claimed is:

1. A hinge for a mobile electronic terminal having an inward-foldable flexible screen, wherein the mobile electronic terminal having the inward-foldable flexible screen is provided with a left side flexible screen main support plate, a right side flexible screen main support plate, a middle housing, a left rotation support plate and a right rotation support plate, the left rotation support plate and the left side main support plate are rotatable about a first axis, the right rotation support plate and the right side main support plate are rotatable about a second axis, the left rotation support plate and the left side main support plate are rotatable relative to each other about a third axis, and the right rotation support plate and the right side main support plate are rotatable relative to each other about a fourth axis; when the mobile electronic terminal having the inward-foldable flexible screen is flattened, the left rotation support plate and the right rotation support plate cover the left side and the right side of the middle housing respectively; when the mobile electronic terminal having the inward-foldable flexible screen is folded, the left rotation support plate and the right rotation support plate incline to the left side main support plate and the right side main support plate respectively, and the inner ends thereof are rotated into the middle housing; the hinge comprises a left side rotation bracket and a right side rotation bracket; a synchronous reverse rotation connecting mechanism is connected between the left side rotation bracket and the right side rotation bracket to realize synchronous reverse rotation;

the hinge is provided with a support structure having the left rotation support plate and the right rotation support plate in the middle housing; the support structure comprises a first support part and a second support part; a first end of the first support part and the left rotation support plate are rotatably connected to each other, a first end of the second support part and the right rotation support plate are rotatably connected to each other; the first support part and the second support part rotate relative to each other to form an X-shaped cross structure, so as to support the left rotation support plate and the right rotation support plate when the electronic terminal having the inward-foldable flexible screen is flattened; and the first support part and the second support part are positioned parallel to each other when the mobile electronic terminal having the inward-foldable flexible screen is folded.

2. The hinge for the mobile electronic terminal having the inward-foldable flexible screen according to claim 1, wherein a second end of the first support part is rotatably connected with a first shaft which is positioned on the right side of the middle housing and rotates in the same direction as the right side rotation bracket; and a second end of the second support part is rotatably connected with a second shaft which is positioned on the left side of the middle housing and rotates in the same direction as the left side rotation bracket.

3. The hinge for the mobile electronic terminal having the inward-foldable flexible screen according to claim 1, wherein the mobile electronic terminal having the inward-foldable flexible screen is provided with reset springs of the left rotation support plate and the right rotation support plate respectively, so that the left rotation support plate is tightly mated with the first support part, and the right rotation support plate is tightly mated with the second support part.

4. The hinge for the mobile electronic terminal having the inward-foldable flexible screen according to claim 1, wherein the left rotation support plate and the right rotation support plate are provided with connecting pins parallel to an axis of the hinge, and the first end of the first support part and the first end of the second support part are provided with connecting holes rotatably connected with the connecting pin of the left rotation support plate and the connecting pin of the right rotation support plate respectively.

5. The hinge for the mobile electronic terminal having the inward-foldable flexible screen according to claim 2, wherein the first shaft is connected with a first driving block, the second shaft is connected with a second driving block, a driving idle stroke is formed between the first driving block and the first support part, and a driving idle stroke is formed between the second driving block and the second support part, so that the driving blocks drive the support parts to rotate only when the mobile electronic terminal having the inward-foldable flexible screen is flattened to a certain degree from a folded state, and the first and second support parts are prevented from rotating reversely when the mobile electronic terminal having the inward-foldable flexible screen is flattened.

6. The hinge for the mobile electronic terminal having the inward-foldable flexible screen according to claim 1, wherein an outer end of the left rotation support plate and an outer end of the right rotation support plate are rotatably connected with the left side rotation bracket and the right side rotation bracket respectively.

7. The hinge for the mobile electronic terminal having the inward-foldable flexible screen according to claim 1, wherein the support part of the left rotation support plate and the support part of the right rotation support plate rotate only when the mobile electronic terminal having the inward-foldable flexible screen is flattened to a certain degree from a folded state, and the first and second support parts are prevented from rotating reversely when the mobile electronic terminal having the inward-foldable flexible screen is flattened.

8. The hinge for the mobile electronic terminal having the inward-foldable flexible screen according to claim 1, wherein when the mobile electronic terminal having the inward-foldable flexible screen is folded, a position of the connection between the first end of the first support part and the left rotation support plate coincides with the first axis, and a position of the connection between the first end of the second support part and the right rotation support plate coincides with the second axis.

9. The hinge for the mobile electronic terminal having the inward-foldable flexible screen according to claim 1, wherein when the mobile electronic terminal having the inward-foldable flexible screen is flattened, the connection between the first end of the first support part and the left rotation support plate is positioned closer to the inward-folded flexible screen than the first axis, and the connection between the first end of the second support part and the right rotation support plate is positioned closer to the inward-folded flexible screen than the second axis.

* * * * *